United States Patent
Itoh et al.

(10) Patent No.: US 7,759,714 B2
(45) Date of Patent: Jul. 20, 2010

(54) SEMICONDUCTOR DEVICE

(75) Inventors: Kiyoo Itoh, Higashikurume (JP); Riichiro Takemura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 189 days.

(21) Appl. No.: 11/768,824

(22) Filed: Jun. 26, 2007

(65) Prior Publication Data

US 2009/0003105 A1    Jan. 1, 2009

(51) Int. Cl.
   *H01L 27/108*    (2006.01)
(52) U.S. Cl. .................. 257/296; 257/E27.084; 365/203
(58) Field of Classification Search ............ 257/351, 257/547, 296, E27.084, E27.112, E21.704, 257/E21.646, 301, 348; 365/203, 156
   See application file for complete search history.

(56) References Cited

U.S. PATENT DOCUMENTS

2005/0276094 A1* 12/2005 Yamaoka et al. ............ 365/154

2007/0210418 A1* 9/2007 Nakajima .................... 257/547

OTHER PUBLICATIONS

M. Yamaoka et al., "Low Power SRAM Menu for SOC Application Using Yin-Yang-Feedback Memory Cell Technology," 2004 Symposium on VLSI Circuits Digest of Technical Papers, Jun. 2004, pp. 288-291.
R. Tsuchiya et al., "Silicon on Thin Box: A new Paradigm of the CMOSFET for Low-Power and High-Performance Application Featuring Wide-Range Back-Bias Control," IEDM Dig. Tech. Papers, Dec. 2004, pp. 631-634.

* cited by examiner

*Primary Examiner*—Thomas L Dickey
*Assistant Examiner*—Fazli Erdem
(74) *Attorney, Agent, or Firm*—Miles & Stockbridge P.C.

(57) ABSTRACT

A high-speed and low-voltage DRAM memory cell capable of operating at 1 V or less and an array peripheral circuit are provided. A DRAM cell is comprised of a memory cell transistor and planar capacitor which utilize a FD-SOI MOST structure. Since there is no junction leakage current, loss of stored charge is eliminated, and the low-voltage operation can be realized. Further, a gate and a well in a cross-coupled type sense amplifier using FD-SOI MOSTs are connected. By this means, a threshold value dynamically changes and high-speed sensing operation can be realized.

15 Claims, 9 Drawing Sheets

FIG. 5

| | 1-T CELL | | 2-T CELL |
|---|---|---|---|
| | 'H' READ | 'L' READ | |
| DL VOLTAGE V(DL) | $V_{DD}/2-\Delta(C_P)+\Delta(C_{WD})+V_{S1}$ | $V_{DD}/2-\Delta(C_P)+\Delta(C_{WD})-V_{S1}$ | $V_{DD}/2-\Delta(C_P)+\Delta(C_{WD})-V_{S2}$ |
| /DL VOLTAGE V(/DL) | $V_{DD}/2-\Delta(C_P)$ | $V_{DD}/2-\Delta(C_P)$ | $V_{DD}/2-\Delta(C_P)+\Delta(C_{WD})+V_{S2}$ |
| VOLTAGE DIFFERENCE (EFFECTIVE SIGNAL) | $V(DL)-V(/DL) = V_{S1}+\Delta(C_{WD})$ | $V(/DL)-V(DL) = V_{S1}-\Delta(C_{WD})$ | $2V_{S2}$ |
| GATE VOLTAGE OF MOST IN ON-STATE | $V_{DD}/2-\Delta(C_P)+\Delta(C_{WD})+V_{S1}$ | $V_{DD}/2-\Delta(C_P)$ | $V_{DD}/2-\Delta(C_P)+\Delta(C_{WD})+V_{S2}$ |

'H': VOLTAGE OF STORAGE NODE $V_{DD}$, 'L': VOLTAGE OF STORAGE NODE 0 V

SEMICONDUCTOR DEVICE

TECHNICAL FIELD OF THE INVENTION

The present invention relates to a semiconductor integrated circuit in which CMOS (Complementary Metal Oxide Semiconductor) circuits are integrated on a semiconductor chip. More particularly, the present invention relates to a circuit architecture and a device architecture for achieving the low-voltage and high-speed operation of a MOS dynamic random access memory (DRAM).

BACKGROUND OF THE INVENTION

Since the variation in threshold voltage $V_T$ of a MOS transistor (MOST) increases along with the miniaturization, the operation speed of the MOSTs in a chip further varies. This variation in speed becomes more pronounced as the operation voltage $V_{DD}$ thereof decreases. Therefore, the MOST with small variation in $V_T$ has been desired for the low-voltage operation. FIG. 9B is a graph shown in "Low Power SRAM Menu for SOC Application Using Yin-Yang-Feedback Memory Cell Technology", by M. Yamaoka et al., Symp. VLSI Circuits Dig., pp. 288-291, June 2004 (Non-Patent Document 1), and as shown in FIG. 9B, the standard deviation a of the variation in $V_T$ increases along with the miniaturization of the bulk MOST. In FIG. 9B, $\sigma_{int}$ represents the standard deviation of a so-called intrinsic $V_T$ determined by the variation in the number of impurity atoms in a channel of the MOST and the variation in the position thereof, and $\sigma_{ext}$ represents the standard deviation of a so-called extrinsic $V_T$ determined by the variation in the size of a channel and the like. The entire variation $\sigma$ in $V_T$ is determined by both the variations. Even in the 90-nm process technology, $\sigma$ is as large as about 30 mV. Since it is necessary to make a design with taking into account the $V_T$ variation ($\Delta V_T$) of about $5\sigma$ in one chip, the value becomes as large as 150 mV.

Therefore, the effective gate voltage of each MOST in a chip expressed by $V_{DD}-(V_{T0}+\Delta V_T)$ largely varies. Here, $V_{T0}$ represents an average $V_T$. Since this gate voltage is almost proportional to the load driving current of the MOST, for example, assuming that $V_{T0}$ is 0.3 V and $\Delta V_T$ is 150 mV, the driving current of the MOST rapidly decreases when $V_{DD}$ becomes 1 V or less, and the driving current becomes 0 and the circuit delay time becomes infinite when $V_{DD}$ becomes 0.45 V. The $V_T$ variation as described above also increases the offset voltage (difference in $V_T$ in paired MOSTs) of a sense amplifier used for a dynamic random access memory (DRAM), which makes the sensing operation unstable.

The variation in speed and the instability of operation due to the miniaturization and the voltage reduction as described above can be suppressed by using a fully-depleted SOI (SOI (Silicon On Insulator) having a fully-depleted double gate structure) (hereinafter, referred to as FD-SOI) MOST. The detailed structure and characteristics of the SOI MOST are described in "Silicon on Thin BOX: A New Paradigm of The CMOSFET for Low-Power and High-Performance Application Featuring Wide-Range Back-Bias Control", by R. Tsuchiya et al., IEDM Dig. Tech Papers, pp. 631-634, December 2004 (Non-Patent Document 2).

The structure shown in the Non-Patent Document 2 will be schematically described below. FIG. 9A shows a sectional view and an equivalent circuit diagram of an N channel MOST (NMOST) and a P channel MOST (PMOST). A gate G is a gate electrode formed of a metal silicide film such as NiSi, a channel forming area just below the gate is a thin film made of single crystal semiconductor (SOI layer), D or S is a P type or N type high-concentration ultrathin drain or source diffusion layer, BOX is a buried oxide layer (BOX layer), an n+ well layer is formed just below the BOX in the PMOST, and a p+ well layer and a deep n well layer (n-Well) are formed just below the BOX in the NMOST, and they are integrated on a p type substrate. The MOST as described above is characterized in that $V_T$ thereof can be controlled according to the type of a gate material, the concentration of the well below the BOX layer, and the voltage applied to the well layer as shown in FIG. 9C. In an actual MOST, the channel length (Lg) is 100 nm or less, the thickness of the SOI layer having the MOST formed therein is 20 nm or less, the thickness of the BOX layer is 10 nm or less, and the concentration of its underlying well layer ranges from $10^{16}$ cm$^{-3}$ to $10^{18}$ cm$^{-3}$. As described above, the standard deviation $\sigma$ of the variation in $V_T$ of the MOST is reduced to 20% or less of the conventional bulk structure by the thin BOX layer and others (FIG. 9B). The variation of the intrinsic $V_T$ determining the offset of a sense amplifier is reduced to one-tenth or less, that is, to an ignorable level because it is a random variation. The double gate MOST structure can be regarded as one MOST in which an upper MOST and a lower MOST are connected in parallel. In this case, in the lower MOST, the well functions as a gate, and the BOX layer functions as a gate insulator. Therefore, as shown in the example of the NMOST in FIG. 9C, the threshold voltage $V_T$ of the entire double gate MOST can be largely changed by changing the well voltage of the lower part. This is because, since the well layer is isolated from others, the well voltage can be largely changed without generating pn junction leakage current.

SUMMARY OF THE INVENTION

On the other hand, in a DRAM, after precharging the paired data lines to $V_{DD}/2$ of a floating state, the minute signal voltage of a memory cell read to the data line by driving the word line is discriminated by a differential amplifier (sense amplifier) with reference to the level of $V_{DD}/2$. This sensing method is called a mid-point sensing, and it is well-known that the method is suitable for the low power consumption because no noise is generated in the memory cell array and charging current of the data line is low. However, since the sense amplifier is operated based on the voltage as low as $V_{DD}/2$, the high-speed operation is difficult in nature. Therefore, if the circuit and device architecture capable of amplifying at high speed even under such conditions can be realized, the $V_{DD}$ can be reduced by that much.

The typical ones of the inventions disclosed in this application will be briefly described as follows.

A semiconductor memory device comprises: a plurality of word lines for driving memory cells; a plurality of paired data lines which cross the word lines and transmit and receive information to and from the memory cells; a plurality of memory cells each comprised of one MOS transistor and one capacitor connected to an intersection between the word line and the data line; and MOS transistors for precharging the data lines, wherein voltage coupled to the data line by precharging the data line is almost equal to or lower than voltage coupled to the data line by driving the word line, and the two coupled voltages have reverse polarities to each other.

More preferably, the voltage coupled to the data line by precharging the data line is coupled toward a minimum value side of voltage which the data line can have, and the voltage coupled to the data line by driving the word line is coupled toward a maximum value side of voltage which the data line can have.

Further, in another aspect of the present invention, a semiconductor memory device comprises: a plurality of word lines for driving memory cells; a plurality of paired data lines which cross the word lines and transmit and receive information to and from the memory cells; a plurality of memory cells each comprised of one MOS transistor and one capacitor connected to an intersection between the word line and the data line; and MOS transistors for precharging the data lines, wherein voltage coupled to the data line by precharging the data line is coupled toward a maximum value side of voltage which the data line can have.

More desirably, precharge voltage of the data line is set to an almost intermediate value of a maximum value and a minimum value of the voltage which the data line can have.

Further, in another aspect of the present invention, a semiconductor device comprises: a circuit including a MOS transistor with a fully depleted SOI structure having a double gate using a first gate and a well layer disposed below a buried oxide film as a second gate; and a memory cell including a MOS transistor with the structure and a capacitor.

More desirably, the capacitor uses a gate of the MOS transistor with the structure as a first electrode and uses a drain or a source of the MOS transistor as a second electrode.

According to the present invention, the voltage reduction, the high-speed operation, and the size reduction of the CMOS DRAM can be achieved.

BRIEF DESCRIPTIONS OF THE DRAWINGS

FIG. 5 is a comparison table of the voltages of the respective paired data lines just before the operation of the sense amplifier, the voltage difference (difference in voltage between the paired lines), and the gate voltage of the MOST to be turned on in the sense amplifier;

DESCRIPTIONS OF THE PREFERRED EMBODIMENTS

The present invention provides a memory cell, a memory cell array, and a peripheral circuit such as a sense amplifier for a high-speed DRAM suitable for a low-voltage DRAM of 1 V or less, by making use of the MOST structure of FD-SOI and its characteristics.

More specifically, by making use of the characteristics of the FD-SOI MOST, the low-voltage DRAM excellent in the stable operation can be realized. As described above, the variation in $V_T$ is small in the FD-SOI MOST, and thus the offset voltage of the sense amplifier can be reduced to an ignorable level. For example, it can be reduced to 5 mV or less in three sigma (standard deviation), and the noise is effectively reduced by that much and the variation in amplification rate becomes small. Therefore, the SOI MOST is a device suitable for a DRAM.

The DRAM using the SOI MOST will be described below in detail based on embodiments.

First Embodiment

Figure 1:
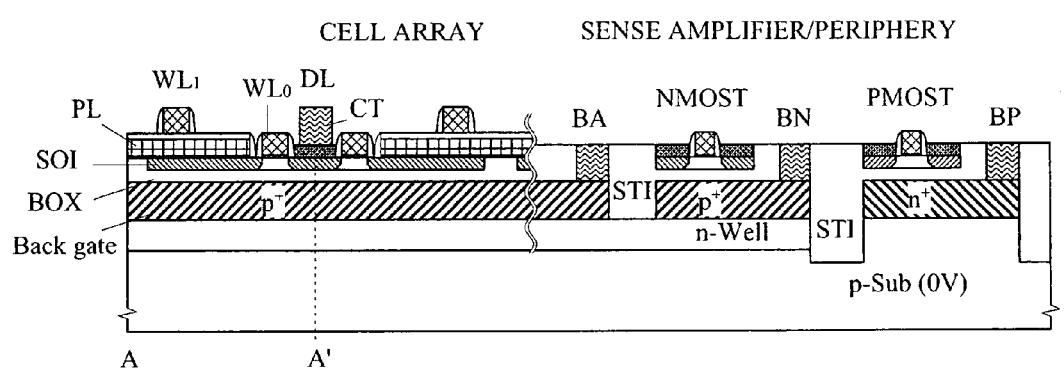
FIG. 1 is a diagram showing the sectional structure of a memory cell and peripheral circuit transistors according to the present invention.
Figure 2A:
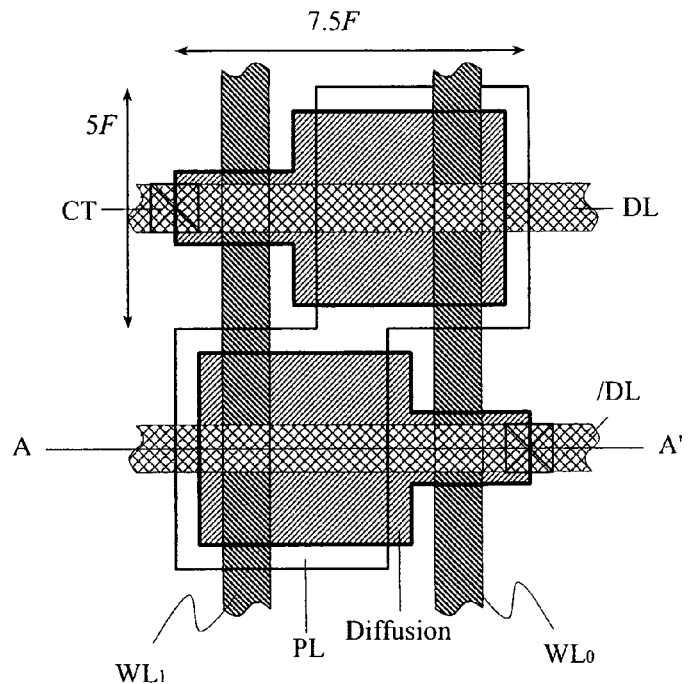
FIG. 2A is a diagram showing the layout example of a 1-T DRAM cell using the FD-SOI MOST.

FIG. 1 is a sectional view of a DRAM using the SOI MOST according to an embodiment of the present invention. In this structure, since superfluous impurities are not diffused in a storage node of the memory cell, the leakage current is low enough to be ignorable. Accordingly, the data retention characteristics are improved, for example, the refresh time is sufficiently increased. Also, even when the alpha ray and the cosmic ray are entered, since the collection area in the cell is extremely small, the soft error can be reduced to an ignorable level. Further, since the variation in $V_T$ is significantly reduced, the offset voltage of the sense amplifier is lowered and the sensitivity thereof is improved. Furthermore, although the word voltage has to be boosted to $V_{DD}+V_T$ or more in order to fully write the high voltage ($V_{DD}$) from the data line to the sell node in a DRAM, this boosting voltage can be reduced owing to the small variation in $V_T$, and since there is no body bias effect, the low-voltage design of the word circuit is possible. Also, the advantage that highly-integrated memory cell and sense amplifier can be configured using almost the same structure as a peripheral logic circuit can be attained. The memory cell (MC) is configured of a switch NMOST and an information storage NMOS capacitor (planar structure in the drawing). In the memory cell, the gate of the NMOST is connected to a word line ($WL_0$ in FIG. 1), and a source or a drain is connected to a data line DL, and a drain or a source is connected to a capacitor electrode. The data line DL formed of a metal wire from a contact in the cell is laid above the word line $WL_0$ so as to cross the word line $WL_0$ as shown in FIG. 2. The capacitor shares the SOI layer, the BOX, and the p type well layer (p+) applied with DC voltage (for example, 0.5 V) with the MOST, and they are formed on a common n-Well. As is well-known, half of the maximum voltage $V_{DD}$ of the data line, that is, $V_{DD}/2$ is applied to the electrode PL. This is because the interelectrode voltage of the capacitor becomes minimum for both the binary information storage voltage $V_{DD}$ and 0 V, the capacitor insulator can be thinned for a predetermined stress voltage, and the capacitance value can be increased by that much. Here, in order to form the large capacitance between the source of the MOST and the electrode PL in the cell even when $V_{DD}$ is written to the cell, it is necessary to deeply deplete the capacitor with the MOS structure in a state where $V_{DD}/2$ is applied to the electrode PL of the capacitor. Since $V_T$ of the switch MOST is an enhancement type in general, the gate (electrode PL) material of the MOS capacitor has to be the one having a work function different from that of the MOST in the end. Generally, a material having a work function smaller than that of the word line material is used for the material of the electrode PL. For example, ErSix is used when the word line material is NiSi, and NiSi is used when the word line material is PtSi. Here, it is required to suppress the subthreshold current in order to obtain sufficient refresh time of the memory cell.

Accordingly, it is necessary to select a certain value, for example, 0.7 V or more for $V_T$ of the MOST. However, in the case where a sufficiently high voltage cannot be selected for $V_T$, as is well-known, $V_T$ can be increased effectively by setting a negative voltage as the word line voltage in the non-selected time. For example, as described later, in the case where $V_{T0}$ is 0.2 V, the word voltage is −0.5 V (described later) in the non-selected time, and when $V_{DD}$ is 0.5 V, 1.2 V is selected in the selected time. Further, in this embodiment, for the miniaturization, the p− well (p+) of the sense amplifier and the p-well (p+) of the array (Back gate) are formed by the same layer, the NMOST in the sense amplifier and the switch NMOST in the cell are isolated by a shallow trench isolation (STI), and the NMOST and the PMOST in the sense amplifier or the peripheral circuit are isolated by other deep trench isolation (STI).

Second Embodiment

Figure 2B:
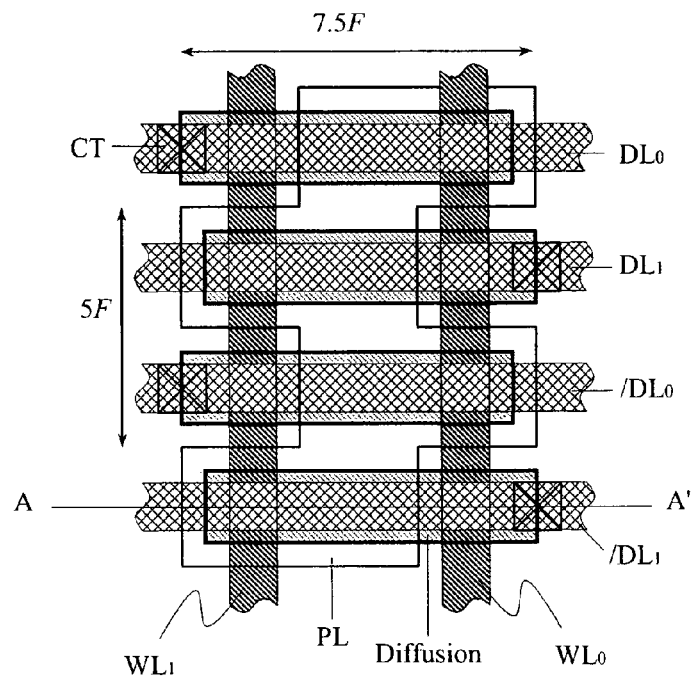
FIG. 2B is a diagram showing the layout example of a 2-T DRAM cell using the FD-SOI MOST.
Figure 3A:
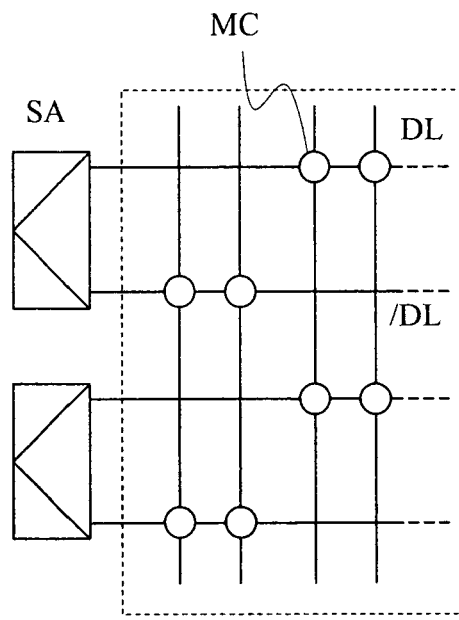
FIG. 3A is a configuration diagram showing an example of an array and a sense amplifier using the memory cell of FIG. 2A.
Figure 3B:
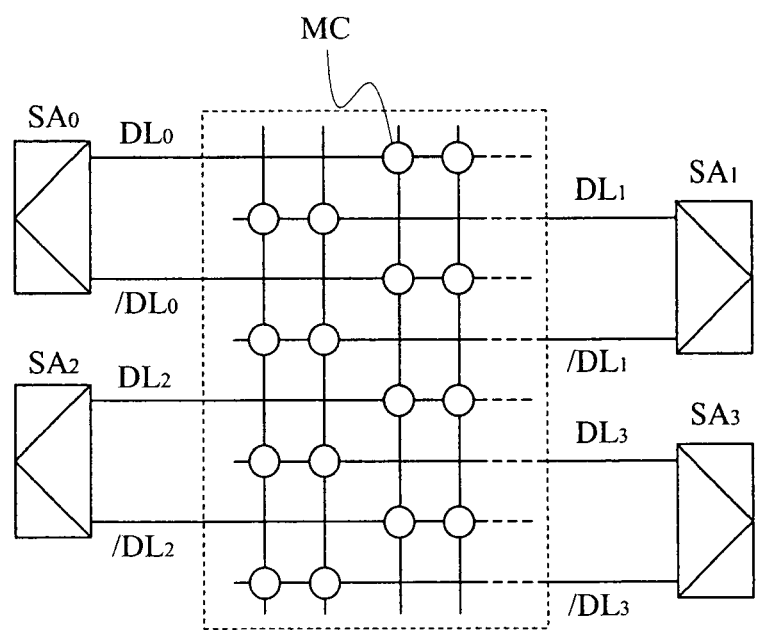
FIG. 3B is a configuration diagram showing an example of an array and a sense amplifier using the memory cell of FIG. 2B.
Figure 4A:
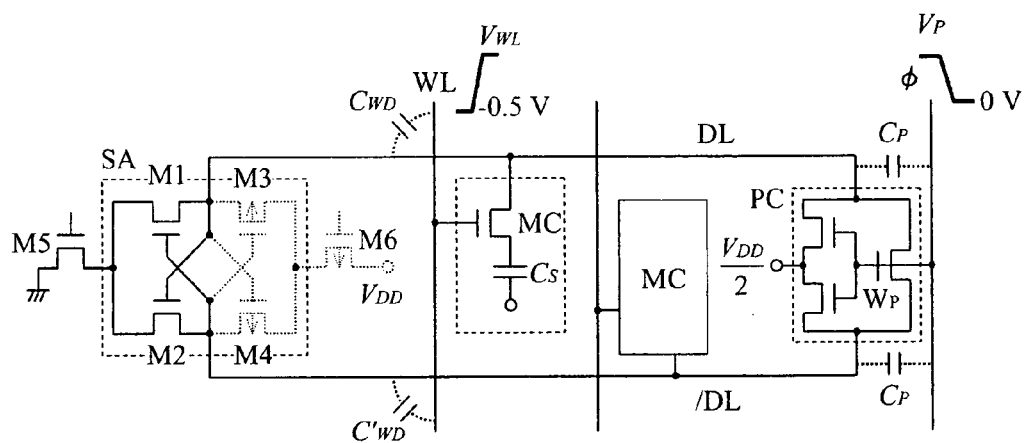
FIG. 4A is a diagram showing the data line and the sense amplifier circuit configuration using the 1-T cell.
Figure 4B:
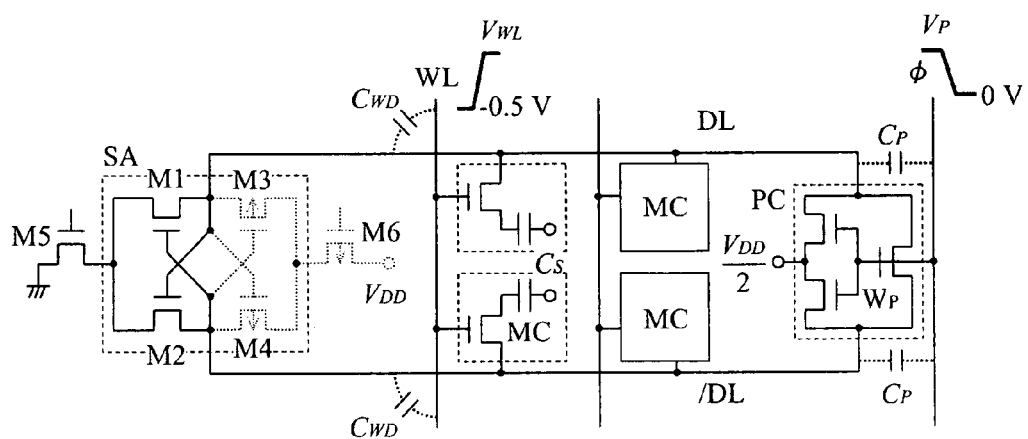
FIG. 4B is a diagram showing the data line and the sense amplifier circuit configuration using the 2-T cell.

FIG. 2 shows two types of cells laid out based on the feature size F, and FIG. 3 shows a data line circuit corresponding to them. Although this is the low-noise and high-integrated cell layout even if the SOI MOST is not used, since the remarkable advantages as described above can be obtained in the SOI structure, the description will be made on the assumption that the SOI structure is formed in the cross section. Note that the cross section of the cell shown in FIG. 1 corresponds to the cross section taken along the A-A' line of these cells. FIG. 3A shows the cell (hereinafter, abbreviated to 1-T cell) connected to one of two intersections between the word line WL and the paired data lines (DL and /DL), and one cell processes one bit of information. The case where the cell connected to DL is read will be considered here. When the stored voltage is $V_{DD}$, the signal voltage $v_S$ determined by the difference between $V_{DD}$ and the precharge voltage $V_{DD}/2$ of the data line, the capacitance $C_S$ of the cell node, and the data line capacitance $C_D$, that is: $v_S=(V_{DD}/2)\cdot C_S/(C_S+C_D)$, is outputted while being superimposed on the floating voltage $V_{DD}/2$ of the data line (DL) after precharging. The polarity thereof is positive to $V_{DD}/2$. When the stored voltage is 0 V, through the same manner, the polarity of the signal is negative. In the 1-T cell, one data line (/DL) voltage remains $V_{DD}/2$, and the above-described positive or negative signal is discriminated by the sense amplifier (SA in the drawing) based on $V_{DD}/2$. The sense amplifier SA in FIG. 4 has a configuration in which cross-coupled NMOS amplifier ($M_1$ and $M_2$) and PMOS amplifier ($M_3$ and $M_4$) are stacked vertically, and after the NMOS amplifier is operated to amplify the signal to some extent, the PMOS amplifier is operated in general. Therefore, it is necessary to amplify the signal by the NMOS amplifier as quick as possible in order to achieve an increase in speed. On the other hand, FIG. 3B shows the cell (hereinafter, abbreviated to 2-T cell) connected to each of the two intersections, and $V_{DD}$ is stored in one of the two cells and 0 V is stored in the other thereof, or conversely, 0 V is stored in one cell and $V_{DD}$ is stored in the other cell to be read, thereby handling the one bit of information. Accordingly, though the combinations thereof differ depending on the stored information, positive and negative signals are always outputted to each of the paired data lines, and the combinations are discriminated by the sense amplifier (SA). In FIG. 2, when compared in one bit, both of the cells have the same cell area (37.5 $F^2$). Therefore, the capacitance value $C_S$ of the capacitor in one cell is smaller in the 2-T cell. For example, in the case where the capacitor oxide film has a thickness of 2.2 nm in the processing technology of 65 nanometer, $C_S$ of 2.0 fF can be realized in the 1-T cell and 0.75 fF can be realized in the 2-T cell by using a high dielectric film with a relative dielectric constant of 6 to 7 such as a silicon oxynitride film (SiON). Since the positive and negative cell signals are read differentially in the 2-T cell, the effective $C_S$ is 1.5 fF which is twice as large as 0.75 fF. Even so, the 1-T cell has a large signal voltage because of the large $C_S$, and since the area of $C_S$ is large, the advantage that $C_S$ is hard to be affected by the process variations can be obtained. Meanwhile, the 2-T cell has the advantage that various types of noises are low. For example, if the layout of FIG. 2B and the operation method of FIG. 3B are combined, the array configuration which is less subject to the adjacent data line can be formed. More specifically, as shown in the drawing, by reading the signal to every other paired data lines, for example, $DL_0$ and $/DL_0$ and $DL_2$ and $/DL_2$ and selectively operating the sense amplifiers $SA_0$ and $SA_2$, since the paired lines to be operated are shielded from each other by the paired lines not to be operated, the noise from other data lines can be suppressed. On the other hand, in the 1-T cell, after the signals are read to all the paired data lines, they are amplified by simultaneously operating all the sense amplifiers. Therefore, the influence of the voltage change in the adjacent data lines easily reaches through the capacitance between data lines. Although this type of noise can be cancelled by crossing the paired lines, the area is inevitably increased. Further, in the 1-T cell, when the sense amplifier is operated in the state where the word line is being driven, the paired data lines are electrically unbalanced by the cell capacitance $C_S$. This unbalance acts as a noise in the amplification of the sense amplifier. On the other hand, in the 2-T cell, since $C_S$ is added to each of the paired lines, the paired data lines are always balanced, and no noise is generated.

Since the voltage coupled from other conductors to the paired data lines also affects the cell operation and the operation of the sense amplifier, the 1-T cell and the 2-T cell will be compared from this point of view. Here, it is assumed that $V_T$ of the memory cell MOST (that is, $V_{TM}$), $V_T$ of the precharge MOST ($V_{TP}$), and $V_T$ of the sense amplifier MOST at the start of the amplification ($V_{TS}$) are 0.2 V, 0.1 V, and 0.1 V, respectively. As described above, $V_{TM}$ of the cell MOST has to be increased to about 0.7 V in order to suppress the subthreshold current of the MOST flowing in the data line in the non-selected time and obtain sufficient refresh time of the cell. In this embodiment, from the aspect of the easiness of the selection of an electrode material of the capacitor and the word line, actual $V_{TM}$ is set to 0.2 V and $V_{TM}$ is effectively set to the required 0.7 V with the assistance of the negative word voltage in the non-selected time of −0.5 V. $V_{TP}$ of the precharge MOST can be adjusted to the same level as $V_T$ of the peripheral logic circuit. In the precharging, after the paired data lines are set to $V_{DD}$ and 0 V, they have to be precharged to $V_{DD}/2$. Therefore, the amplitude of the precharge signal has to be $V_{DD}+V_{TP}$ or more. $V_{TS}$ of the sense amplifier is preferably low. This is because it is required to increase the effective gate voltage of the sense amplifier MOST at the start of amplification as much as possible. However, this value has a lower limit. This is because, when $V_T$ is excessively low, even if the read signal is to be amplified, the MOST is instantaneously conducted and the signal disappears. The sensing time is at most about 10 ns, and it can be further shortened in actual because it is sufficient if the signal can be retained for such an amount of time, and $V_{TS}$ can be reduced to about −0.05 V.

The coupled voltage to the paired data lines under such conditions will be examined. As described above, since the coupled noise from the adjacent data lines can be reduced, it is ignored here. The timing of coupling the voltage until the signal voltage is sensed is at the end of precharging and at the time of driving the word line. The case shown in FIG. 4 where the memory cell MC connected to the data line DL is read will be described as an example. When the precharge signal with the amplitude $V_P$ is driven from a high level to a low level and the precharge circuit PC configured of NMOS is turned off, the voltage $\Delta(C_P)$ in a negative direction is equally coupled to the paired data lines by the capacitance $C_P$ between the driving line and the data line, more concretely, by the total gate capacitance of the three MOSTs configuring the precharge circuit. Since the gate capacitance is formed only during a period when the precharge signal drops from $V_P$ to about $V_{DD}/2+V_{TP}$, the coupled voltage is expressed by the following expression.

$$\Delta(C_P)=(V_P-V_{DD}/2-V_{TP})\cdot C_P/(C_P+C_D)$$

Also, when driving the word line, voltage is coupled to respective data lines by the capacitance between the word lines and the data lines, and it is superimposed on the signal voltage. In the 1-T cell, the signal voltage is always read only to the data line DL to which the cell is connected and is not read to other data lines. Further, the capacitance between lines $C_{WD}$ on the side to which the cell is connected is the large gate capacitance via the MOST. Meanwhile, the capacitance between lines $C'_{WD}$ on the side to which no cell is connected is the cross-wire capacitance which is small enough to be ignorable. Therefore, the voltage $\Delta(C_{WD})$ in the positive direction almost corresponding to $C_{WD}$ is coupled to the data line DL, but is not coupled to other data line /DL. Since the gate capacitance is formed only during a period when the word voltage drops from $V_W$ to about $V_{DD}/2+V_{TM}$, the coupled voltage is expressed by the following expression.

$$\Delta(C_{WD})=(V_W-V_{DD}/2-V_{TM})C_{WD}/(C_{WD}+C_S+C_D)$$

The coupled voltage is obtained for the 2-T cell in the same manner. However, in the 2-T cell, the positive and negative signals are always read to the paired data lines though the combination of positive and negative signals differs depending on the stored information of the cell. Also, $\Delta(C_{WD})$ described above is also equally coupled to the paired data lines.

Figure 6A:
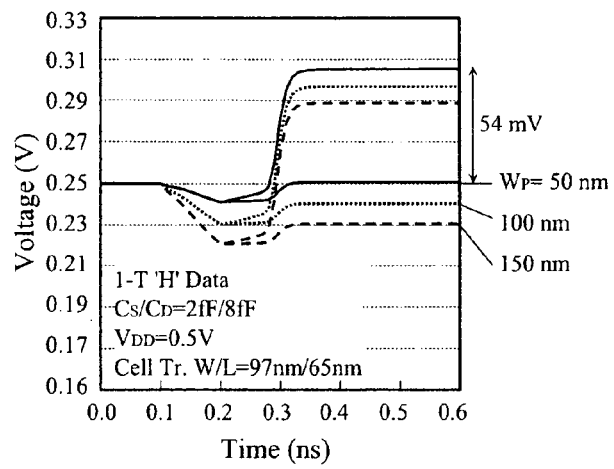
FIG. 6A is a graph showing an example of waveforms of the read operation before the sensing operation in the 1-T cell.
Figure 6B:
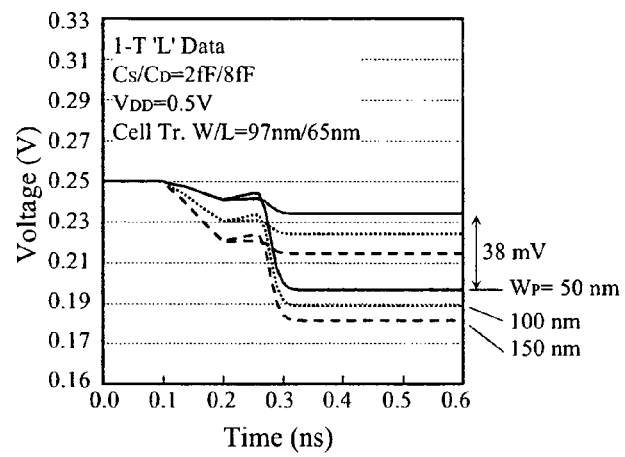
FIG. 6B is a graph showing an example of waveforms of the read operation before the sensing operation in the 1-T cell.
Figure 6C:
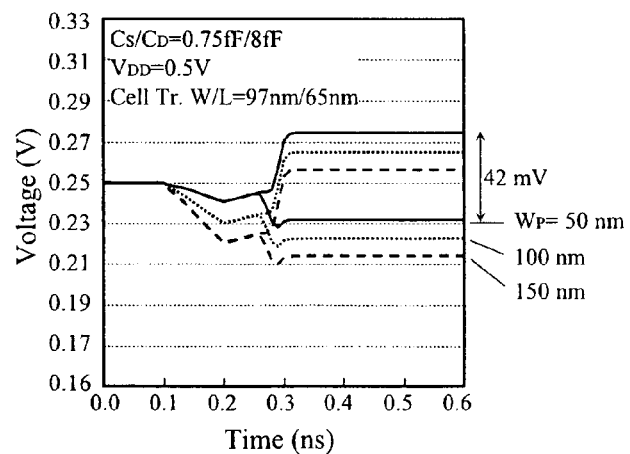
FIG. 6C is a graph showing an example of waveforms of the read operation before the sensing operation in the 2-T cell.

FIG. 5 is a table showing the comparison in the voltage of the paired data lines just before the operation of the sense amplifier, the voltage difference (voltage difference between paired lines), and the gate voltage of MOST to be turned on in the sense amplifier. As is apparent from FIG. 5, in the 1-T cell, the effective signal voltage taking into account the coupled voltage is reduced by $\Delta(C_{WD})$ in the negative signal ('L' Read in FIG. 5), and conversely, it is increased by $\Delta(C_{WD})$ in the positive signal ('H' Read in FIG. 5). On the other hand, in the 2-T cell, it is always constant and is equal to the sum of positive and negative signals. Further, in the 1-T cell, the gate voltage of the MOST to be turned on in the sense amplifier is smaller in 'L' Read than that in 'H' Read by the sum of the $\Delta(C_{WD})$ and the signal voltage ($v_{S1}$). Therefore, the high-speed operation of the sense amplifier is determined by the 'L' Read. On the other hand, in the 2-T cell, it is larger than that in the 'L' Read by the sum of $\Delta(C_{WD})$ and the signal voltage thereof ($v_{S2}$). In other words, the sense amplifier operates at higher speed in the case of the 2-T cell. Regardless of the 1-T cell and the 2-T cell, in order to sense the cell signal at high speed, the higher the gate voltage of the MOST to be first turned on, the better. For its achievement, under the condition that the signal voltage and $V_{DD}$ are constant, as is understood from FIG. 5, $\Delta(C_P)$ is reduced as much as possible, or $\Delta(C_{WD})-\Delta(C_P)$ is increased as much as possible. Therefore, the coupled voltage at the precharging has to be reduced from that at the time of driving the word line as much as possible, or the coupled voltage at the precharging has to be reduced as much as possible. It can be achieved by, for example, reducing the size of the MOST in the precharge circuit or reducing the voltage amplitude of the precharge signal. This is obvious from the waveform of the voltage of the paired data lines before the activation of the sense amplifier in FIG. 6. FIG. 6 show the waveforms obtained by setting the coupled voltage at the time of driving the word line to be constant and using the channel width $W_P$ of one of the three MOSTs configuring the precharge circuit as a parameter. As is clear from it, the reference voltage at the precharging increases as $W_P$ becomes lower in both of the 'L' Read and the 'H' Read. Alternatively, by configuring the precharge circuit from PMOS and raising the precharge signal from a low level to a high level at precharging in a more proactive manner, the coupled voltage of the data line becomes the positive direction, and thus, the effective gate voltage is further increased and the sensing speed can be further increased.

In the 1-T cell using the bulk CMOS, different from the FD-SOI, the problems of the leakage current in the cell and the soft error occur, which decreases the stored voltage in the case where the 'H' side, that is, $V_{DD}$ is stored. Therefore, when 'H' is read to the data line DL, the difference voltage to the voltage of the data line /DL (reference voltage), that is, the signal voltage thereof is reduced. Since the signal voltage in the case where 'L' side, that is, 0 V is stored is increased relatively, the coupled voltage $\Delta(C_{WD})-\Delta(C_P)$ may be reduced by the amount equivalent to the above-described reduction. In other words, $\Delta(C_P)$ may be increased conversely. Further, regardless of the FD-SOI and the bulk CMOS, in the 2-T cell, in view of the magnitude of the signal voltage of the positive and negative polarities and the magnitude of the gate voltage of the sense amplifier MOST, the coupled voltage is sometimes set so that the signals of the positive and negative polarities are symmetrically read about the central value of $V_{DD}/2$ (250 mV). For its achievement, as the gate size of the precharge MOST, $W_P$=50-100 nm which is about half of the gate area of the memory cell MOST is desired.

Third Embodiment

Figure 7:
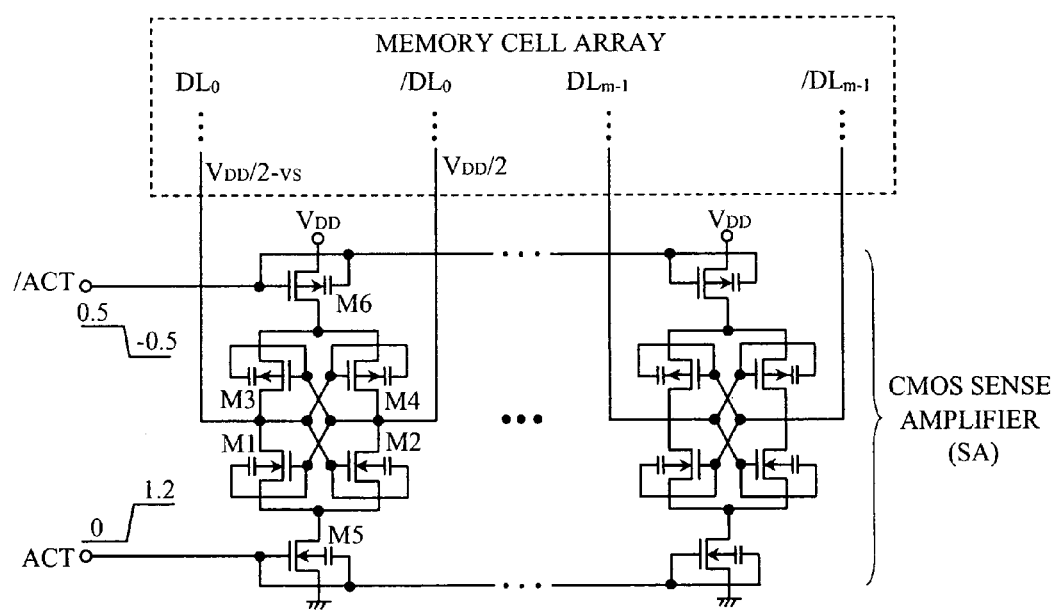
FIG. 7 is a diagram showing the circuit configuration of the sense amplifier in which the gate and the well are connected.
Figure 8A:
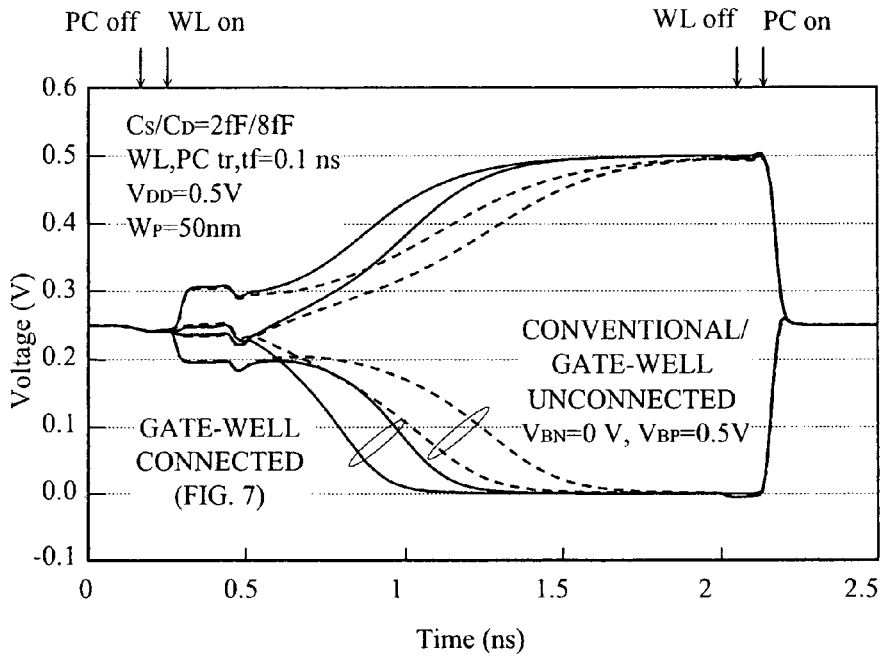
FIG. 8A is a graph showing the cycle operations using the gate-well connected sense amplifier and gate-well unconnected sense amplifier of the 1-T cell.
Figure 8B:
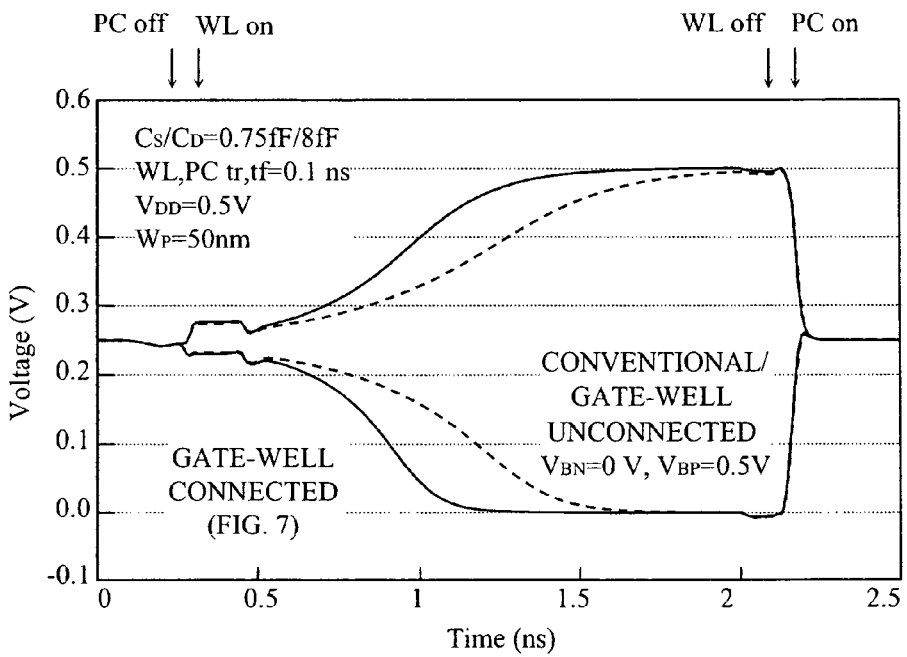
FIG. 8B is a graph showing the cycle operations using the gate-well connected sense amplifier and gate-well unconnected sense amplifier of the 2-T cell.
Figure 9A:
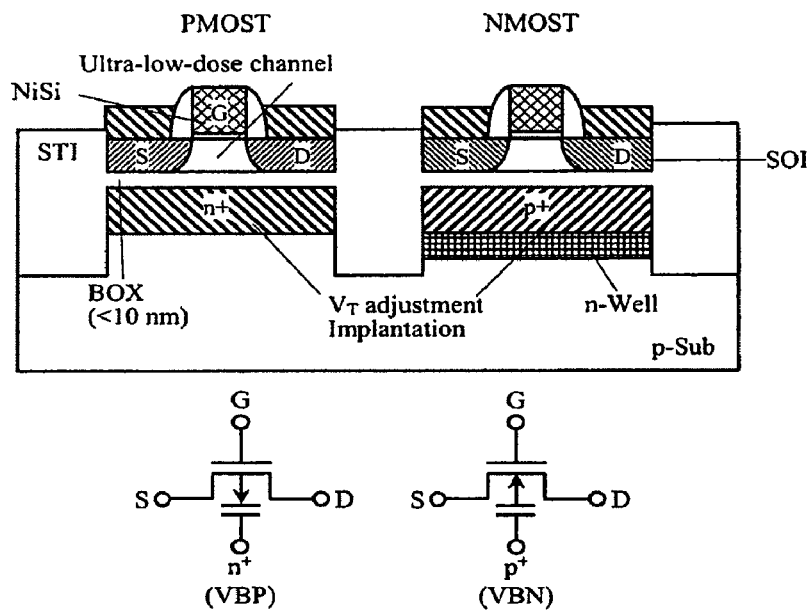
FIG. 9A is a diagram showing the sectional structure of the SOI MOST.
Figure 9B:
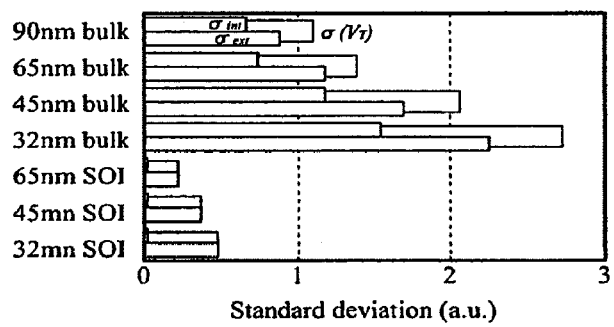
FIG. 9B is a diagram showing the comparison of the variation in threshold value of the bulk MOST and the SOI MOST.
Figure 9C:
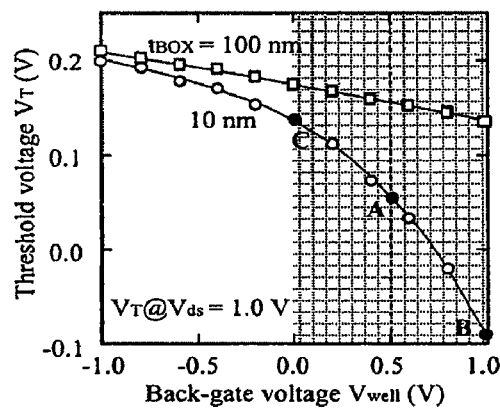
FIG. 9C is a diagram showing the well voltage dependency of the threshold voltage.

FIG. 7 shows an embodiment in which a gate and a well (terminal BN in FIG. 1) of each MOST of a sense amplifier are connected, and $V_T$ of each MOST is dynamically changed to operate the sense amplifier at high speed. Regardless of the 1-T cell and the 2-T cell, even the totally new enhancement/depletion type sense amplifier capable of the dynamic operation can be realized. This is obvious from the example of the NMOST of FIG. 9C and $V_{DD}$=1 V. Since both the gate voltage and the well voltage of $M_1$ and $M_2$ are $V_{DD}/2$ (0.5 V) at the end of the precharging, $V_T$ thereof is 0.05 V (point A). When the negative signal $v_S$ is read to the data line $DL_0$ and the amplification thereof is started, the sense amplifier activation signal ACT is turned on, and $M_1$ in the NMOS amplifier first starts to be turned on and the gate voltage of $M_2$ starts to decrease. At this time, since $v_S$ is small, $M_2$ is slightly turned on to decrease the gate voltage of $M_1$. However, due to the voltage difference of $v_S$, it does not decrease so much as the gate voltage of $M_2$. In this process, $V_T$ of $M_2$ is increased, and it acts so as not to decrease the gate voltage of $M_1$. In other words, the difference in $V_T$ of both MOSTs is increased with the passage of time, and the difference in the gate voltage thereof is further increased, that is, the amplification is accelerated. By this means, the gate ($DL_0$) of $M_2$ is kept discharging. Subsequently, when the PMOS amplifier is turned on by its activation signal /ACT, since the voltage difference has already occurred in the paired data lines, $V_T$ of the PMOST $M_4$ is smaller than that of $M_3$. Therefore, the data line /DL is further charged by $M_4$. By this means, $V_T$ of the NMOST $M_1$ is reduced, and the discharge of the data line is further accelerated. In the final stage of the amplification, the data line DL is discharged to 0 V and /DL is charged to $V_{DD}$. Since $V_T$ of the MOST in an ON state is further reduced and $V_T$ of the MOST in an OFF state is further increased, the amplification is finished at high speed owing to its feedback effect. After the completion of the amplification, even when $V_T$ of the NMOST ($M_1$, $M_4$) in an ON state is decreased (point B in FIG. 9C), since $V_T$ of the MOS ($M_2$, $M_3$) in an OFF state is sufficiently increased (point C in FIG. 9C), the well-known subthreshold current does not flow to the two inverters, that is, the inverter composed of $M_1$ and $M_3$ and the inverter composed of $M_2$ and $M_4$ because one of them always has large $V_T$. For example, in the example of the NMOST having the BOX of 10 nm where $V_{DD}$=1 V in FIG. 9C, since the NMOST in the inverter to which 1 V is inputted has the well voltage of 1 V, $V_T$ thereof is negative voltage of 0.1 V, and since the NMOST to which 0 V is inputted has the well voltage of 0 V, $V_T$ thereof is positive voltage of 0.1 V or more. It is true of the PMOST. When the NMOST in the inverter is in an enhancement state, the other PMOST is in a depletion state. More specifically, the sense amplifier according to this embodiment can achieve the high-speed amplification by the small subthreshold current because of the high current driving ability of the depletion type MOST and the high $V_T$ of the enhancement type MOST. As the MOST structure, the high sensitivity of $V_T$ to the well voltage is desired. It can be achieved by reducing the thickness of the BOX layer. Even when $V_{DD}$ is even lower, for example, when it is 0.5 V or less, by setting the thickness of the BOX layer to the lower limit that does not cause the problem of the tunnel current of an oxide film, for example, to about 2 nm, the sensitivity of $V_T$ to the gate voltage is increased, and the depletion type MOST can be realized. FIG. 8 shows the operation waveforms obtained for both the 1-T cell and the 2-T cell. The waveforms in the case where the gate and the well are connected and the case where the gate and the well are not connected are obtained for each of them. In this case, it is assumed that the data line capacitance $C_D$ corresponding to the case where 32 cells are connected to each data line is 8 fF, the capacitance $C_S$ of the cell node is 2 fF (1-T) and 0.75 fF (2-T), the data line voltage $V_{DD}$ is 0.5 V, the gate size $W_P$ of the precharge MOST is 50 nm, the size W/L of the cell transistor is 97 nm/65 nm, and the rise time tr and the fall time tf of the word line and the precharge signal are 0.1 ns. Further, in the configuration where the gate and the well are not connected, the substrate voltage $V_{BN}$ of the NMOST is set to 0 V and the substrate voltage of the PMOST $V_{BP}$ is set to 0.5 V. It is obvious that the high-speed operation can be realized by connecting the gate and the well.

What is claimed is:

1. A semiconductor device, comprising:
a circuit including a first MOS transistor with a fully depleted SOI structure having a first well layer below a first buried oxide film; and
a first memory cell including a second MOS transistor with a fully depleted SOI structure having a second well layer below a second buried oxide film and a first capacitor coupled to the second MOS transistor and holding charges supplied through the second MOS transistor.

2. The semiconductor device according to claim 1,
wherein the second MOS transistor further has a first semiconductor film provided on the second buried oxide film, a first gate insulating film provided on the first semiconductor film, and a first gate electrode provided on the first gate insulating film,
wherein a first source region and a first drain region are formed in the first semiconductor film, and
wherein the first capacitor has a first electrode provided on one of the first source region and the first drain region of the first semiconductor film via the first gate insulating film and uses said one of the first source region and the first drain region of the first semiconductor film as a second electrode of the capacitor.

3. The semiconductor device according to claim 2,
a second memory cell including a third MOS transistor with a fully depleted SOI structure having a third well layer below a third buried oxide film, a second semiconductor film provided on the third buried oxide film, a second gate insulating film provided on the second semiconductor film, and a second gate electrode provided on the second gate insulating film, and a second capacitor coupled to the third MOS transistor and holding charges supplied through the third MOS transistor,
wherein the first and second semiconductor films are formed in a same layer, and
wherein the second and third well layers are formed in a same layer.

4. The semiconductor device according to claim 3,
wherein the second and third well layers are formed on a fourth well layer.

5. The semiconductor device according to claim 3,
wherein DC voltage is applied to the second and third well layers.

6. The semiconductor device according to claim 2,
wherein a material of the first gate electrode of the second MOS transistor is different from that of the first electrode of the first capacitor.

7. The semiconductor device according to claim 3,
wherein the second capacitor has a third electrode provided on the second semiconductor film, and
wherein the first electrode and the third electrode are formed in a same layer.

8. The semiconductor device according to claim 1,
wherein the first capacitor has a substantially planar structure.

9. The semiconductor device according to claim 2,
wherein the first gate electrode of the second MOS transistor is coupled to a word line, and
wherein the other one of the first source region and the first drain region is coupled to a data line.

10. The semiconductor device according to claim 9,
wherein DC voltage equal to about half the maximum voltage of the data line is supplied to first electrode of the first capacitor.

11. The semiconductor device according to claim 6,
wherein a work function of a material of the first gate electrode of the second MOS transistor is higher than that of a material of the first electrode of the first capacitor.

12. The semiconductor device according to claim 9,
wherein the second MOS transistor is an N type MOS transistor, and
wherein negative voltage is applied to the first gate electrode of the second MOS transistor during a non-selected time.

13. The semiconductor device according to claim 1, further comprising:
a sense amplifier having cross-coupled MOS transistors,
wherein the cross-coupled MOS transistors and the second MOS transistor are formed on a fourth well layer.

14. The semiconductor device according to claim 1,
wherein the circuit has a sense amplifier having cross-coupled MOS transistors, and
wherein one of the cross-coupled MOS transistors is the first MOS transistor.

15. The semiconductor device according to claim 14,
wherein each of the cross-coupled MOS transistors dynamically changes between a depletion mode and an enhancement mode.

\* \* \* \* \*